(12) United States Patent
Fujita et al.

(10) Patent No.: US 11,877,473 B2
(45) Date of Patent: Jan. 16, 2024

(54) OPTICAL LAMINATE, DISPLAY PANEL, AND DISPLAY DEVICE

(71) Applicant: DAI NIPPON PRINTING CO., LTD., Tokyo (JP)

(72) Inventors: Kenji Fujita, Tokyo (JP); Takashi Kuroda, Tokyo (JP)

(73) Assignee: DAI NIPPON PRINTING CO., LTD., Tokyo (JP)

(*) Notice: Subject to any disclaimer, the term of this patent is extended or adjusted under 35 U.S.C. 154(b) by 603 days.

(21) Appl. No.: 16/956,347

(22) PCT Filed: Dec. 18, 2018

(86) PCT No.: PCT/JP2018/046511
§ 371 (c)(1),
(2) Date: Jul. 29, 2020

(87) PCT Pub. No.: WO2019/124347
PCT Pub. Date: Jun. 27, 2019

(65) Prior Publication Data
US 2020/0411802 A1    Dec. 31, 2020

(30) Foreign Application Priority Data
Dec. 22, 2017 (JP) ................................ 2017-246999

(51) Int. Cl.
*H10K 50/86* (2023.01)
*G02B 1/11* (2015.01)
*G02B 5/30* (2006.01)

(52) U.S. Cl.
CPC ............... *H10K 50/86* (2023.02); *G02B 1/11* (2013.01); *G02B 5/3033* (2013.01)

(58) Field of Classification Search
CPC ......... H01L 51/5281; G02B 1/11; G02B 5/30; G02B 5/3025; G02B 5/3033; G02B 5/3083; G02B 27/28
See application file for complete search history.

(56) References Cited

U.S. PATENT DOCUMENTS

2004/0189908 A1* 9/2004 Kawamoto ......... G02F 1/13362
                                                    349/117
2008/0174872 A1* 7/2008 Morimoto ............... G02B 5/208
                                                    359/585

(Continued)

FOREIGN PATENT DOCUMENTS

CN    102127249    7/2011
CN    102368100    3/2012

(Continued)

OTHER PUBLICATIONS

International Search Report of PCT/JP2018/046511, dated Mar. 26, 2019, 5 pages including English translation.

*Primary Examiner* — Stephone B Allen
*Assistant Examiner* — Adam W Booher
(74) *Attorney, Agent, or Firm* — Hamre, Schumann, Mueller & Larson, P.C.

(57) ABSTRACT

The present invention relates to an optical laminate capable of providing a display panel in which worsening of visibility owing to reflected colors is suppressed. Furthermore, the present invention provides a display panel including the aforementioned optical laminate; a display device including the foregoing optical laminate; and an antireflection layer, a circular polarizing plate, a retardation plate, and a polarizing plate, each of which is used for the aforementioned display panel.
The optical laminate includes a circular polarizing plate having a retardation plate and a polarizer, and an antireflection layer having a surface reflectance of 2% or less, wherein (Continued)

the antireflection layer is provided on the polarizer side of the circular polarizing plate; and L* of light incident from the antireflection layer side in the SCI mode is 20 or less, and a saturation is 20 or less.

9 Claims, 3 Drawing Sheets

(56) References Cited

U.S. PATENT DOCUMENTS

| | | | |
|---|---|---|---|
| 2009/0068377 A1* | 3/2009 | Kuki | G02B 1/14 428/323 |
| 2012/0055621 A1 | 3/2012 | Goto et al. | |
| 2012/0056211 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058321 A1 | 3/2012 | Goto et al. | |
| 2013/0100529 A1 | 4/2013 | Kitagawa et al. | |
| 2016/0091632 A1 | 3/2016 | Shmatsu et al. | |
| 2017/0068106 A1 | 3/2017 | Murayama et al. | |
| 2017/0160452 A1 | 6/2017 | Yasuda | |
| 2017/0278902 A1 | 9/2017 | Choi et al. | |
| 2020/0142255 A1* | 5/2020 | Kitagawa | H01L 51/50 |

FOREIGN PATENT DOCUMENTS

| | | | |
|---|---|---|---|
| CN | 105467473 | 4/2016 | |
| CN | 106501894 | 3/2017 | |
| JP | 2003-121649 | 4/2003 | |
| JP | 2006-072315 | 3/2006 | |
| JP | 2006-091276 | 4/2006 | |
| JP | 2006-126799 | 5/2006 | |
| JP | 2006-171235 | 6/2006 | |
| JP | 2008262187 A | * 10/2008 | G02B 1/111 |
| JP | 2009-231257 | 10/2009 | |

* cited by examiner

| Antireflection layer |
|---|
| Hard coat layer |
| TAC (protective layer) |
| Polarizer |
| TAC (protective layer) |
| λ/4 plate (45°) |
| Pressure-sensitive adhesive layer |
| Aluminum foil |
| Glass |

[Fig. 4]

| Antireflection layer |
|---|
| Hard coat layer |
| TAC (protective layer) |
| Polarizer |
| TAC (protective layer) |
| λ/2 plate (15°) |
| Pressure-sensitive adhesive layer |
| λ/4 plate (75°) |
| Pressure-sensitive adhesive layer |
| Aluminum foil |
| Glass | de
OPTICAL LAMINATE, DISPLAY PANEL, AND DISPLAY DEVICE

TECHNICAL FIELD

The present invention relates to an optical Laminate, a display panel, and a display device.

BACKGROUND ART

In recent years, various display devices show in treads for an increase in hue is required in various observation environments.

PTL 1 discloses an organic electro luminescence light source device in which a change in hue due to an observation angle is suppressed.

CITATION LIST

Patent Literature

PTL 1: JP 2009-231257 A

SUMMARY OF INVENTION

Technical Problem

The present inventors have found that a display device including an optical laminate having a circular polarizing plate having an antireflection layer provided therewith involves such a problem that when light incident from the antireflection layer side reflects, visibility of a displayed image is worsened. Although various proposals have hitherto been made regarding the change in hue of video light due to an observation angle, any studies for obtaining favorable visibility focusing on reflective hue are not made. In addition, there is also involved a problem of coloration of an image due to external light reflection at the time of power-off.

The present invention is one solving such problems, and an object thereof is to provide an optical laminate capable of providing a display panel in which worsening of visibility inclusive of reflected colors is suppressed. Furthermore, the present invention is aimed to provide a display panel including the aforementioned optical laminate; a display device including the foregoing optical laminate; and an antireflection layer, a circular polarizing plate, a retardation plate, and a polarizing plate, each of which is used for the aforementioned display panel.

Solution to Problem

In order to solve the aforementioned problem, the present inventors made extensive and intensive investigations. As a result, it has been found that the aforementioned problem is solved by not only providing an antireflection layer having a low reflectance but also regulating L* and a saturation of light incident from the antireflection layer side in the SCI mode to specified ranges, respectively.

The present invention relates to the following [1] to [11].

[1] An optical laminate including a circular polarizing plate having a retardation plate and a polarizer, and an antireflection layer having a surface reflectance of 2% or less, wherein the antireflection layer is provided on the polarizer side of the circular polarizing plate; and L* of light incident from the antireflection layer side in the SCI mode is 20 or less, and a saturation is 20 or less.

[2] The optical laminate as set forth in [1] wherein an arithmetic average roughness Ra of the antireflection layer in a cutoff value of 0.08 mm according to JIS B0601:1994 is 50 nm or less.

[3] The optical laminate as set forth in [1] or [2], wherein the circular polarizing plate has a ¼ wavelength retardation plate having reverse dispersion wavelength characteristics.

[4] The optical laminate as set forth in any of [1] to [3], wherein the circular polarizing plate has a ¼ wavelength retardation plate and a ½ wavelength retardation plate.

[5] A display panel including the optical laminate as set forth in any of [1] to [4].

[6] A display device including the display panel as set forth in [5].

[7] The display device as set forth in [6], wherein the display device is an organic electro luminescence display device.

[8] An antireflection layer used for the display panel as set forth in [5].

[9] A circular polarizing plate used for the display panel as set forth in [5].

[10] A retardation plate used for the display panel as set forth in [5].

[11] A polarizer used for the display panel as set forth in [5].

Advantageous Effects of Invention

In accordance with the present invention, there is provided an optical laminate capable of providing a display panel in which worsening of visibility to be caused due to reflected colors is suppressed. Furthermore, in accordance with the present invention, there are provided a display panel including the aforementioned optical laminate; a display device including the foregoing optical laminate; and an antireflection layer, a circular polarizing plate, a retardation plate, and a polarizing plate, each of which is used for the aforementioned optical laminate.

DESCRIPTION OF EMBODIMENTS

In the following description, the description of "A to B" indicating a numerical value range indicates a numerical value range including end points. That is, "A or more and B or less" (in the case of A<B), or "A or less and B or more" (in the case of A>B), is meant. In addition, in the following description, a combination of preferred embodiments is a more preferred embodiment.

Embodiments of the present invention are hereunder described.

[Optical Laminate]

The optical laminate of the present invention includes a circular polarizing plate having a retardation plate and a polarizer, and an antireflection layer having a surface reflectance of 2% or less, wherein the antireflection layer is provided on the polarizer side of the circular polarizing plate; and L* of light incident from the antireflection layer side in the SCI mode is 20 or less, and a saturation is 20 or less.

The present inventors have found that with respect to the visibility of a display device including an optical laminate having a circular polarizing plate and an antireflection layer, by not only regulating a surface reflectance of the antireflection layer to a specified range but also regulating L* and a saturation of light incident from the antireflection layer side in the SCI mode to specified ranges, respectively, worsening of the visibility to be caused due to reflection is suppressed.

Although a detailed mechanism from which the aforementioned effects are obtained is not elucidated yet, a part thereof may be considered as follows.

That is, it has been found that by using the antireflection layer having a surface reflectance of 2% or less, the reflection per se of the light incident from the antireflection layer side is suppressed to some degree, and the visibility of the reflected light itself is lowered; however, by providing the antireflection layer, the saturation increases, resulting in occurrence of a problem that the visibility is worsened as a whole. On the other hand, it may be assumed that by adopting a combination of the circular polarizing plate and the antireflection layer, in which the saturation falls within a specified range, the optical laminate in which worsening of the visibility to be caused due to reflection as a total is suppressed was obtained.

In consequence, it may be considered that by regulating the L* of incident light in the SCI mode to 20 or less and the saturation to 20 or less, respectively, even when the reflected light is present, an influence of the reflected light against the visibility was suppressed.

The present invention is hereunder described in detail.

In the optical laminate of the present invention, not only the L* of light incident from the antireflection layer side in the SCI (specular component included) mode is 20 or more, but also of the saturation is 20 or less.

Here, as for the SCI mode, the measurement is performed including a specular reflection component. In the present invention, the measurement of L*, a*, and b* is performed according to JIS Z8722-2009 (Condition c). The saturation is calculated from $(a^{*2}+b^{*2})^{1/2}$. L*, a*, and b* are numerical values measured in a state where an aluminum foil is disposed on the rear surface of the optical laminate (on the opposite side to the incident light side) via a pressure-sensitive adhesive layer.

In addition, L*, a*, and b* each mean an average value of measured values at 16 points and can be, for example, determined by the method described in the section of Examples. In this specification, as for the 16 measurement points, on the occasion when an area of 1 cm from an outer edge of a measurement sample is made as a margin, and a line dividing the longitudinal direction and the lateral direction into five equal parts is drawn with respect to an area inside the foregoing margin, it is preferred to center an intersection point of 16 points for the measurement. In the case where the measurement sample is a quadrilateral, it is preferred that the measurement is performed by making an area of 1 cm from an outer edge of the quadrilateral as a margin and centering an intersection point of 16 points of a line dividing the longitudinal direction and the lateral direction into five equal parts with respect to an area inside the foregoing margin, and an average value thereof is calculated. In the case where the measurement sample has a shape other than the quadrilateral, such as a circle, an ellipse, a triangle, and a pentagon, it is preferred that a quadrilateral of the largest area inscribed in such a shape is written, and 16 points are measured with respect to the quadrilateral by the aforementioned method.

A representative SCI measurement device uses D65 as a light source for an integrating sphere spectrophotometer; a position of a light receiver is +8° relative to the normal of the sample; an aperture angle of the light receiver is 10°; and a position of a light trap is −8° relative to the normal of the sample; and a coverage range of the light trap is 10°.

From the viewpoint of suppressing the change in hue, the L* is preferably 18 or less, more preferably 15 or less, still more preferably 12 or less, and yet still more preferably 10 or less, and though a lower limit thereof is not particularly limited, from the viewpoint of productivity, it is preferably 1 or more, and more preferably 3 or more.

The saturation is preferably 15 or less, more preferably 12 or less, and still more preferably 10 or less, and though a lower limit thereof is not particularly limited, from the viewpoint of productivity, it is preferably 1 or more, and more preferably 1.5 or more.

In the present invention, it may be considered that by providing the optical laminate or the display panel each satisfying the aforementioned L* and saturation, the change in hue to be viewed is suppressed.

A representative SCI measurement device uses D65 as a light source for an integrating sphere spectrophotometer; a position of a light receiver is +8° relative to the normal of the sample; an aperture angle of the light receiver is 10°; and a position of a light trap is −8° relative to the normal of the sample; and a coverage range of the light trap is 10°.

From the viewpoint of suppressing the change in hue, the L* is preferably 18 or less, more preferably 15 or less, still more preferably 12 or less, and yet still more preferably 10 or less, and though a lower limit thereof is not particularly limited, from the viewpoint of productivity, it is preferably 1 or more, and more preferably 3 or more.

The saturation is preferably 15 or less, more preferably 12 or less, and still more preferably 10 or less, and though a lower limit thereof is not particularly limited, from the viewpoint of productivity, it is preferably 1 or more, and more preferably 1.5 or more.

In the present invention, it may be considered that by providing the optical laminate or the display panel each satisfying the aforementioned L* and saturation, the change in hue to be viewed is suppressed.

<Circular Polarizing Plate>

The optical laminate or the display panel of the present invention has a circular polarizing plate and an antireflection layer. The circular polarizing plate has a role such that it is disposed on an organic electro luminescence display device or a resistance film type touch panel, to exhibit an antireflection ability.

It is preferred that the circular polarizing plate is disposed on the near side to a light source.

The circular polarizing plate has a retardation plate and a polarizing plate. Here, the circular polarizing plate as well as the retardation plate and the polarizing plate as mentioned later may be in a film-like shape, or may be formed by means of coating or the like, to form a layer, and they are not limited to a mode in which a platy shape is formed alone.

In the circular polarizing plate, the retardation plate is provided on the light source side, and the polarizing plate is provided on the antireflection layer side.

(Retardation Plate)

The retardation plate is preferably a ½ wavelength retardation plate (hereinafter also referred to as "λ/2 retardation plate"), a ¼ retardation plate (hereinafter also referred to as "λ/4 retardation plate"), or a combination thereof. In the present invention, the retardation plate is preferably a λ/4 retardation plate with reverse dispersion properties, or a laminate of a λ/4 retardation plate and a λ/2 retardation plate.

In the λ/2 retardation plate, an in-plane retardation (Re550) at a wavelength of 550 nm is preferably 200 to 300 nm, more preferably 220 to 280 nm, and still more preferably 240 to 275 nm.

In the λ/4 retardation plate, an in-plane retardation (Re550) at a wavelength of 550 nm is preferably 100 to 180 nm, more preferably 110 to 160 nm, and still more preferably 120 to 150 nm.

When a refractive index in the slow axis direction in the plane is defined as nx, a refractive index in the direction orthogonal to the nx in the plane is defined as ny, and a film thickness is defined as d (nm), the in-plane retardation (Re) can be expressed by the following equation.

$$\text{In-plane retardation (Re)} = (nx - ny) \times d$$

The retardation plate may be one exhibiting wavelength dispersion properties of positive dispersion (hereinafter also referred to as "positive dispersion properties"), or may be one exhibiting wavelength dispersion properties of reverse dispersion (hereinafter also referred to as "reverse dispersion properties").

The reverse dispersion properties are characteristics such that as the wavelength of transmitted light is long, the retardation given to the transmitted light increases, and specifically, they are characteristics such that a relation between the in-plane retardation (Re450) at a wavelength of 450 nm and the in-plane retardation (Re550) at a wavelength of 550 nm becomes (Re450<Re550). The other positive dispersion properties are characteristics such that the foregoing relation becomes (Re450>Re550).

Taking into the retardation to be given, a thickness of the retardation plate can be appropriately regulated within a range of 0.1 to 10 μm.

The retardation plate which is used in the present invention may be made of a retardation support having itself a targeted λ/4 or λ/2 function, or the like, may have a retardation layer on a support (transparent support) made of a polymer film, or may be constituted of a retardation layer alone. In the case where the retardation plate is configured of a retardation layer alone, the desired λ/4 function or λ/2 function may also be brought by laminating other layer on a support with optical isotropy. The retardation layer is not particularly restricted with respect to a constituent material thereof, and it may be a retardation layer formed of a composition containing a liquid crystal compound, may be a retardation layer resulting from stretching of a polymer film, or may have the both layers.

Above all, the retardation plate is preferably a laminate of a transparent support and a retardation layer.

<<Transparent Support>>

In the present invention, though a material of the transparent support is not particularly restricted, one with optical isotropy is preferred. The optical isotropy refers to the matter that the Re550 is 5 nm or less.

Various polymer films, for example, cellulose acylate; a polycarbonate-based polymer; a polyester-based polymer, such as polyethylene terephthalate and polyethylene naphthalate; an acrylic polymer, such as polymethyl methacrylate; and a styrene-based polymer, such as polystyrene and an acrylonitrile/styrene copolymer (AS resin), can be utilized. In addition, the transparent support may be fabricated using one or more polymers from a polyolefin, such as polyethylene and polypropylene; a polyolefin-based polymer, such as an ethylene/propylene copolymer; a vinyl chloride-based polymer; an amide-based polymer, such as a nylon and an aromatic polyamide; an imide-based polymer; a sulfone-based polymer; a polyethersulfone-based polymer; a polyetheretherketone-based polymer; a polyphenylene sulfide-based polymer; a vinylidene chloride-based polymer; an vinyl alcohol-based polymer; a vinylbutyral-based polymer; an arylate-based polymer; a polyoxymethylene-based polymer; an epoxy-based polymer; or a mixed polymer of the aforementioned polymers.

In the case where the retardation plate is a laminate of a polymer film (transparent support) and a retardation layer, it is preferably a laminate of a polymer film (transparent support) and a retardation layer formed of a composition containing a liquid crystal compound. A polymer film with small optical anisotropy may be used, or a polymer film in which optical anisotropy is revealed through a stretching treatment or the like may be used. It is preferred that the support has a light transmittance of 80% or more.

A thickness of the transparent support is preferably 10 μm to 200 μm, more preferably 10 to 80 μm, and more preferably 20 to 60 μm.

<<Liquid Crystal Compound>>

The kind of the liquid crystal compound which is used for forming the retardation layer is not particularly limited. For example, a retardation layer obtained by forming a low-molecular weight liquid crystal compound to be nematic-aligned in a liquid crystal state and then fixing the alignment through photocrosslinking or thermal crosslinking; or a retardation layer obtained by forming a high-molecular weight liquid crystal compound to be nematic-aligned in a liquid crystal state and then fixing the alignment by cooling may be used. In the present invention, even in the case where a liquid crystal compound is used for the retardation layer, the retardation layer is a layer formed upon fixation of the liquid crystal compound through polymerization or the like, and after the layer has been formed, the resulting liquid crystal compound is no longer required to exhibit liquid crystallinity. The polymerizable liquid crystal compound may be a polyfunctional polymerizable liquid crystal compound or may be a monofunctional polymerizable liquid crystal compound. In addition, the liquid crystal compound may be a discotic liquid crystal compound or may be a rod-like liquid crystal compound.

In the retardation layer, it is preferred that the liquid crystal compound is fixed in any one alignment state of vertical alignment, horizontal alignment, hybrid alignment, and oblique alignment. From the viewpoint that the viewing angle dependency can be made symmetric, it is preferred that the plane of the disk of the discotic liquid crystal compound is substantially perpendicular to the plane of the film (plane of the retardation layer), or the major axis of the rod-like liquid crystal compound is substantially horizontal to the plane of the film (plane of the retardation layer).

What the discotic liquid crystal compound is substantially perpendicular means an average value of an angle formed between the plane of the film (plane of the retardation layer) and the plane of the disk of the discotic liquid crystal compound is in a range of 70° to 90°. The foregoing average value of the angle is preferably in a range of 80° to 90°, and more preferably in a range of 85° to 90°.

What the rod-like liquid crystal compound is substantially horizontal means an angle formed between the plane of the film (plane of the retardation layer) and the director of the rod-like liquid crystal compound is in a range of 0° to 20°. The foregoing angle is preferably in a range of 0° to 10°, and more preferably in a range of 0° to 5°.

In the case where the retardation plate contains the retardation layer containing a liquid crystal compound, the retardation layer may be composed of only a single layer or may be a laminate of two or more retardation layers.

The retardation layer containing a liquid crystal compound can be formed by coating a coating liquid containing a liquid crystal compound, such as a rod-like liquid crystal compound and a discotic liquid crystal compound, and if desired, a polymerization initiator or an alignment controlling agent as mentioned later, or other additive on the transparent support. It is preferred that an alignment film is formed on the transparent support, and the coating liquid is coated on the surface of the alignment film, to form the retardation layer. A thickness of the retardation layer is preferably 0.1 to 10 μm, more preferably 0.5 to 5 μm, and still more preferably 1 to 5 μm.

Discotic Liquid Crystal Compound

In the present invention, for formation of the retardation layer, it is preferred to use the discotic liquid crystal compound. The discotic liquid crystal compound is described in various literatures (for example, C. Destrade, et al., Mol. Crysr. Liq. Cryst., vol. 71, page 111 (1981); The Chemical Society of Japan, Quarterly Chemistry Review, No. 22, Liquid Crystal Chemistry, Chapter 5, Chapter 10, Section 2 (1994) Yearly); B. Kohne, et al., Angew. Chem. Soc. Chem. Comm., page 1794 (1985); and J. Zhang, et al., J. Am. Chem. Soc., vol. 116, page 2655 (1994)). The polymerization of the discotic liquid crystal compound is described in JP 8-27284 A.

It is preferred that the discotic liquid crystal compound has a polymerizable group such that it is fixable through polymerization. For example, though a structure in which a polymerizable group is bound as a substituent to a disk-like core of a discotic liquid crystal compound may be considered, when the polymerizable group is directly bound to the disk-like core, it becomes difficult to keep the alignment state in the polymerization reaction. Then, a structure having a linking group between the disk-like core and the polymerizable group is preferred. That is, the discotic liquid crystal compound having a polymerizable group is preferably a compound represented by the following formula.

In the formula, D is a disk-like core; L is a divalent linking group; P is a polymerizable group; and n is an integer of 1 to 12. Preferred specific examples of the disk-like core (D), the divalent linking group (L), and the polymerizable group (P) are (D1) to (D15), (L1) to (L25), and (P1) to (P18), respectively as described in JP 2001-4837 A, and the contents described in the foregoing patent literature can be preferably used. A discotic nematic liquid crystal phase-solid phase transition temperature of the liquid crystal compound is preferably 30 to 300° C., and more preferably 30 to 170° C.

Rod-like Liquid Crystal Compound

In the present invention, a rod-like liquid crystal compound may be used for formation of the retardation layer which the retardation plate has. As the rod-like liquid crystal compound, there are preferably exemplified an azomethine compound, an azoxy compound, a cyanobiphenyl compound, a cyanophenyl ester compound, a benzoic acid ester compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolane compound, and an alkenylcyclohexylbenzonitrile compound. Not only the aforementioned low-molecular liquid crystal compounds but also high-molecular liquid crystal compounds can also be used. It is more preferred to fix the alignment of the rod-like liquid crystal compound through polymerization. The liquid crystal compound preferably has a partial structure capable of causing polymerization or crosslinking reaction with actinic rays, electron beams, heat, or the like, and more preferably has a polymerizable group.

The number of the partial structure is preferably 1 to 6, and more preferably 1 to 3. As the polymerizable rod-like liquid crystal compound, compounds described in Makromol. Chem., vol. 190, page 2255 (1989), Advanced Materials, vol. 5, page 107 (1993), U.S. Pat. Nos. 4,683,327, 5,622,648, and 5,770,107, WO 95/22586 A, WO 95/24455 A, WO 97/00600 A, WO 98/23580 A, WO 98/52905 A, JP 1-272551 A, JP 6-16616 A, JP 7-110469 A, JP 11-80081 A, JP 2001-328973, and so on can be used.

Specific examples of the rod-like liquid crystal compound include compounds represented by the following formulae (1) to (17).

(3)

(4)

(5)

(6)

(7)

(8)

(9)

(10)

(11)

(12)

(13)

g: integer of 2 to 5

(14)

(15)

(16)

(17)

Examples of the liquid crystal compound exhibiting reverse dispersion properties include compounds described in various publications of unexamined applications, such as JP 2010-537954 A, JP 2010-537955 A, JP 2010-522892 A, JP 2010-522893 A, and JP 2013-509458 A, as well as various patent gazettes, such as Japanese Patents Nos. 5892158, 5979136, 5994777, and 6015655.

The liquid crystal compound can be used alone or in combination of two or more thereof. In the case of using a single liquid crystal compound alone, it is preferred that the single liquid crystal compound is a polymerizable liquid crystal compound. In addition, in the case of using a combination of two or more liquid crystal compounds, it is preferred that at least one of them is a polymerizable liquid crystal compound, and it is more preferred that all of them are a polymerizable liquid crystal compound.

<<Polymerization Initiator>>

The aligned liquid crystal compound is fixed while maintaining the alignment state. For the fixation, it is preferred to adopt a polymerization reaction, and the polymerization reaction includes a thermal polymerization reaction using a thermal polymerization initiator and a photopolymerization reaction using a photopolymerization initiator. Of these, the photopolymerization reaction is preferred. Examples of the photopolymerization initiator include an α-carbonyl compound (see U.S. Pat. Nos. 2,367,661 and 2,367,670), an acyloin ether (see U.S. Pat. No. 2,448,828), an α-hydrocarbon-substituted aromatic acyloin compound (see U.S. Pat. No. 2,722,512), a polynuclear quinone compound (see U.S. Pat. Nos. 3,046,127 and 2,951,758), a combination of a triaryl imidazole dimer and p-aminophenyl ketone (see U.S. Pat. No. 3,549,367), acridine and a phenazine compound (see JP 60-105667 A and U.S. Pat. No. 4,239,850), and an oxadiazole compound (see U.S. Pat. No. 4,212,970).

The used amount of the polymerization initiator is preferably 0.01 to 20% by mass, and more preferably 0.5 to 5% by mass relative to the total solid content of the retardation layer-forming composition. As for light irradiation for polymerization of the liquid crystal compound, it is preferred to use ultraviolet rays. The irradiation energy is preferably 20 mJ/cm$^2$ to 50 J/cm$^2$, and more preferably 100 to 800 mJ/cm$^2$. In order to promote the photopolymerization reaction, the light irradiation may be carried out under a heating condition.

<<Surfactant>>

It is preferred that the retardation layer-forming composition contains a surfactant. In addition, among surfactants, at least one selected from a fluorine-based surfactant having a polymerizable group and a silicon-based surfactant having a polymerizable group is preferably selected and used.

The content of the surfactant is preferably 0.01 to 2.0% by mass, and more preferably 0.1 to 1.0% by mass relative to the total solid content of the retardation layer-forming composition.

<<Solvent>>

The retardation layer-forming composition typically contains a solvent.

Examples of the solvent include a ketone (e.g., acetone, methyl ethyl ketone, methyl isobutyl ketone, cyclopentanone, cyclohexanone, and N-methyl-2-pyrrolidone), an ether (e.g., dioxane and tetrahydrofuran), an aliphatic hydrocarbon (e.g., hexane), an alicyclic hydrocarbon (e.g., cyclohexane), an aromatic hydrocarbon (e.g., toluene and xylene), a halocarbon (e.g., dichloromethane and dichloroethane), an ester (e.g., methyl acetate, ethyl acetate, and butyl acetate), an alcohol (e.g., butanol and cyclohexanol), a cellosolve (e.g., methyl cellosolve and ethyl cellosolve), a cellosolve acetate, a sulfoxide (e.g., dimethyl sulfoxide), and an amide (e.g., dimethyl formamide and dimethyl acetamide). A mixture thereof is also useful.

The retardation layer can be, for example, formed by coating the retardation layer-forming composition, followed by drying and curing. In addition, it is preferred to coat the retardation layer-forming composition on the alignment film.

<<Vertical Alignment Promoter>>

On the occasion of forming the retardation layer, in order to uniformly vertically align the molecule of the liquid crystal compound, it is preferred to use an alignment controlling agent capable of vertically controlling the alignment of the liquid crystal compound on the alignment film interface side and the air interface side. For achieving this object, it is preferred to form the retardation layer on the alignment film by using a composition containing a compound acting to vertically align the liquid crystal compound owing to an excluded volume effect, an electrostatic effect, or a surface energy effect together with the liquid crystal compound. In addition, with respect to the alignment control on the air interface side, it is preferred to form the retardation layer by using a composition containing a compound which is unevenly distributed on the air interface at the time of alignment of the liquid crystal compound and which acts to vertically align the liquid crystal compound owing to an excluded volume effect, an electrostatic effect, or a surface energy effect together with the liquid crystal compound. As a compound (vertical alignment promoter on the alignment film interface side) which promotes to vertically align the molecule of the liquid crystal compound on the alignment film interface side, a pyridinium derivative is suitably used. As a compound (vertical alignment promoter on the air interface side) which promotes to vertically align the molecule of the liquid crystal compound on the air interface side, a compound containing a fluoro aliphatic group and at least one hydrophilic group selected from the group consisting of a carboxy group (—COOH), a sulfo group (—SO$_3$H), a phosphonoxy group {—OP(=O)(OH)$_2$}, and a salt thereof is suitably used. In addition, by blending such a compound, for example, in the case where the liquid crystal composition is prepared as a coating liquid, the coating properties of the coating liquid are improved, and occurrence of unevenness and cissing is suppressed.

As for the vertical alignment promoter, the description in paragraphs [0101] to [0185] of WO 2013/100115 A is made by reference.

<<Other Additive>>

In the present invention, the retardation layer-forming composition may include, in addition to the aforementioned components, a plasticizer, a polymerizable monomer, and so on. It is preferred that such a component has compatibility with the liquid crystal compound and does not hinder the alignment.

As the polymerizable monomer, a radical polymerizable or cation polymerizable compound is exemplified, and a compound which is a polyfunctional radical polymerizable monomer and is a compound copolymerizable with the aforementioned polymerizable group-containing liquid crystal compound is preferred. Examples thereof include compounds described in paragraphs [0018] to [0020] of JP 2002-296423 A. The addition amount of the polymerizable compound is preferably 1 to 50 parts by mass, and more preferably 5 to 30 parts by mass based on 100 parts by mass of the liquid crystal compound.

<<Coating Method of Retardation Layer>>

Coating of the retardation layer-forming composition can be carried out by a known method (for example, a wire bar coating method, an extrusion coating method, a direct gravure coating method, a reverse gravure coating method, and a die coating method).

<<Alignment Film>>

The retardation plate may have an alignment film.

The alignment film has a role to make it easy to align the liquid crystal compound within the retardation layer on the occasion of forming the retardation layer by coating the retardation layer-forming composition, followed by drying and curing.

Even when the alignment film has at the time of forming the retardation layer, an optical laminate not having the alignment film can be obtained so long as not only the retardation layer is transferred into other member, but also the alignment film is made to be not transferred at the time of transfer.

The alignment film can be formed into an alignment layer by, for example, coating an alignment layer-forming composition on a transparent substrate, to give an alignment regulating force. The alignment film-forming composition can be appropriately selected from conventionally known materials, such as a photodimerization type material, and used.

As means for giving an alignment regulating force to the alignment film, conventionally known means can be adopted, and examples thereof include a rubbing method, a photo-alignment method, and a shaping method.

A thickness of the alignment film is preferably 1 to 1,000 nm, and more preferably 60 to 300 nm.

(Polarizer)

In the present invention, it is preferred that the circular polarizing plate has a retardation plate and a polarizer, and it is preferred that the polarizer forms a polarizing plate together with a protective film.

All of an iodine-based polarizer as well as a dye-based polarizer and a polyene-based polarizer each using a dichroic dye may be used as the polarizer.

In general, the iodine-based polarizer and the dye-based polarizer are produced by using a polyvinyl alcohol-based film. An absorption axis of the polarizer is corresponding to the stretching direction of the film. In consequence, the polarizer stretched in the vertical direction (transport direction) has an absorption axis which is parallel to the longitudinal direction, and the polarizer stretched in the horizontal direction (vertical direction to the transport direction) has an absorption axis which is vertical to the longitudinal direction.

In general, the polarizer has a protective film. In the present invention, an antireflection layer as mentioned later, or the retardation plate as mentioned above, can be allowed to function as the protective film of the polarizer. Separately from the aforementioned antireflection layer or retardation plate, in the case of laminating the protective film of the polarizer, a cellulose ester film with high optical isotropy is preferably used as the protective film.

By using a linear polarizer as the polarizer and combining it with the aforementioned retardation plate, a polarizer-integrated laminate functioning as the circular polarizing plate can be produced with high productivity.

<Antireflection Layer>

The optical laminate or the display panel of the present invention has an antireflection layer, and a surface reflectance of the antireflection layer is 2% or less.

Here, the surface reflectance of the antireflection layer is one determined by providing a black support on the rear surface thereof and measuring a reflection Y value at an incidence angle of 5° relative to a spectral reflectance at 380 to 780 nm in conformity with JIS Z8722:1982.

From the viewpoint of more suppressing the change in hue to be caused due to reflected colors, the surface reflectance of the antireflection layer is preferably 1.5% or less, more preferably 1.2% or less, still more preferably 0.8% or less, yet still more preferably 0.5 or less, and even yet still more preferably 0.2% or less.

A wavelength (reflection bottom wavelength) at which a spectral reflectance of the antireflection layer at an incidence angle of 5° exhibits a minimum value is typically set in the vicinity of 550 nm. As a general rule, in the antireflection layer of the optical laminate of the present invention, it is also preferred to set the reflection bottom wavelength in the vicinity of 550 nm.

In the case of using, as the retardation plate, one having reverse dispersion characteristics, it is preferred to shift the bottom wavelength of the antireflection layer to a shorter wavelength side than 550 nm. Specifically, in the case of using, as the retardation plate, one having reverse dispersion characteristics, the bottom wavelength of the antireflection layer is set to preferably 500 to 545 nm, more preferably 510 to 540 nm, and still more preferably 515 to 535 nm.

The retardation plate having reverse dispersion characteristics has properties such that a deviation from ideal wavelength dispersion properties is small, as compared with the retardation layer having positive dispersion characteristics. But, even in the retardation plate having reverse dispersion characteristics, a deviation from the ideal wavelength dispersion properties is generated in a short-wavelength region. For this reason, the circular polarizing plate having the retardation layer having reverse dispersion characteristics cannot completely cut the short-wavelength region and comes to look slightly bluish. On the other hand, by shifting the bottom wavelength of the antireflection layer to a shorter wavelength side than 550 nm, the reflectance on the long-wavelength side increases, and the reflected light comes to look reddish. In consequence, by combining the circular polarizing plate having the retarding layer having reverse dispersion characteristics with the antireflection layer in which the bottom wavelength has been shifted to the shorter wavelength side than 550 nm, the bluish tint of the circular polarizing plate and the reddish tint of the antireflection layer are made to offset from each other, so that the color tint observed from the antireflection layer side can be made inconspicuous.

The position of the reflection bottom wavelength can be simulated from the refractive indices and the film thicknesses of the antireflection layer, the hard coat layer, and the substrate. On the occasion of measuring the spectral reflectance of the antireflection layer, similar to the time of measuring the reflection Y value, it is preferred to provide a black support on the rear surface thereof.

In the present invention, from the viewpoint of the fact that the display image becomes vivid, it is preferred that the surface of the antireflection layer is smooth, and an arithmetic average roughness Ra of the surface of the antireflection layer in a cutoff value of 0.08 mm to be measured according to JIS B0601:1994 is preferably 50 nm or less, more preferably 30 nm or less, still more preferably 10 nm or less, and yet still more preferably 5 nm or less.

The aforementioned arithmetic average roughness is an arithmetic average roughness on the surface of the opposite side to the side on which the circular polarizing plate of the antireflection layer is provided.

In the antireflection layer, the a* of light incident from the opposite side to the side on which the circular polarizing plate is provided in the SCI mode is preferably −10 to 10, more preferably −7 to 7, and still more preferably −3 to 3. In addition, in the antireflection layer, the b* of light incident from the opposite side to the side on which the circular polarizing plate is provided in the SCI mode is preferably −10 to 10, more preferably −7 to 7, and still more preferably −3 to 3.

From the viewpoint of suppressing the change in hue, the L* is preferably 20 or less, more preferably 15 or less, and still more preferably 10 or less. In view of the fact that the L* of the antireflection layer falls within the aforementioned range, the visibility is more improved.

With respect to the measurement method of L*, a*, and b*, these values are each a value determined by providing a black support on the rear surface of the antireflection layer (on the opposite side to the incident light side) and measuring at an angle of 5°.

In the present invention, by using the antireflection layer satisfying the aforementioned L* and saturation, worsening of the visibility is more suppressed.

The antireflection layer is of a configuration in which only a low refractive index layer is painted on the outermost surface of a film (transparent substrate) according to the simplest configuration. Furthermore, in order to decrease the surface reflectance, it is preferred to configure the antireflection layer resulting from combination of a high refractive index layer having a high refractive index and a low refractive index layer having a low refractive index. Examples of the configuration include a two-layer configuration of a high refractive index layer and a low refractive index layer in order from the bottom; and a configuration in which three layers having a different refractive index from each other are laminated in the order of a middle refractive index layer (layer having a higher refractive index than a lower layer and having a lower refractive index than a high refractive index layer), a high refractive index layer, and a low refractive index layer. There is also proposed a configuration in which more antireflection layers are laminated. Above all, from the standpoint of durability, optical characteristics, costs, productivity, and so on, a configuration in which a middle refractive index layer, a high refractive index layer, and a low refractive index layer are provided in order on a hard coat layer is preferred, and examples thereof include configurations described in JP 8-122504 A, JP 8-110401 A, JP 10-300902 A, JP 2002-243906 A, and JP 2000-111706 A. In addition, an antireflection film of a three-layer configuration, which is excellent in robustness relative to a film thickness fluctuation, is described in JP 2008-262187 A. In the case where the aforementioned antireflection film having a three-layer configuration is installed on the surface of an image display device, an average value of the surface reflectance can be regulated to 0.5% or less, reflected glare can be remarkably reduced, and an image with an excellent stereoscopic effect can be obtained. In addition, other function may be given to each of the layers, and examples thereof include those forming an antifouling low refractive index layer, an antistatic high refractive index layer, an antistatic hard coat layer, and an antifouling hard coat layer (see, for example, JP 10-206603 A, JP 2002-243906 A, and JP 2007-264113 A).

A refractive index of the low refractive index layer is preferably 1.26 to 1.40, more preferably 1.28 to 1.38, and still more preferably 1.30 to 1.32. A thickness of the low refractive index layer is preferably 80 to 120 nm, more preferably 85 to 110 nm, and still more preferably 90 to 105 nm.

A refractive index of the high refractive index layer is preferably 1.55 to 1.85, and more preferably 1.56 to 1.70. In addition, a thickness of the high refractive index layer is preferably 200 nm or less, and more preferably 50 to 180 nm.

<Functional Layer>

The optical laminate or the display panel of the present invention may further have a functional layer, such as a hard coat layer and an antifouling layer, in addition to the aforementioned circular polarizing plate and antireflection layer.

<Layer Configuration of Optical Laminate>

Figure 1:
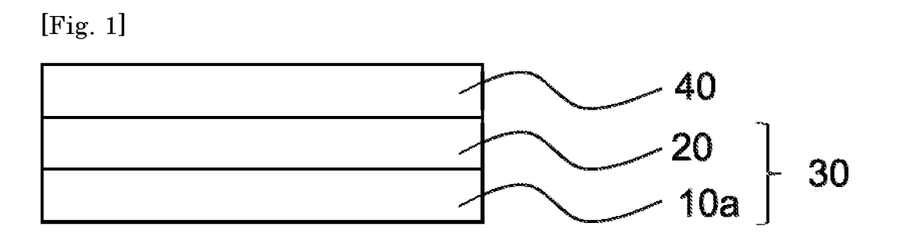
FIG. 1 is a cross-sectional view schematically showing an example of the optical laminate of the present invention.
Figure 2:
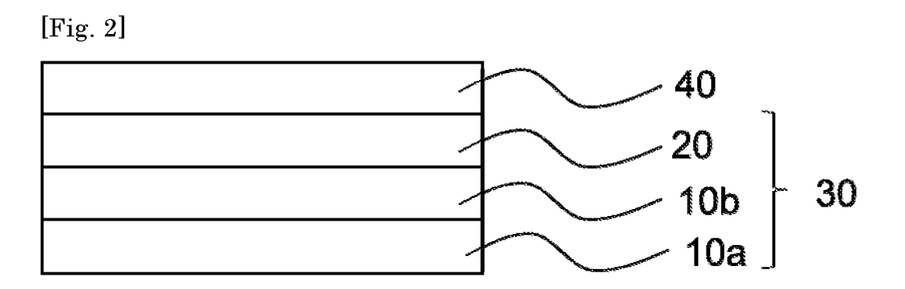
FIG. 2 is a cross-sectional view schematically showing another example of the optical laminate of the present invention.

FIGS. 1 and 2 are each a cross-sectional view schematically showing an embodiment of the optical laminate of the present invention. In the optical laminate (first embodiment) of FIG. 1, a circular polarizing plate 30 has a λ/4 retardation plate 10a and a polarizing plate 20. In addition, an antireflection layer 40 is laminated on the circular polarizing plate. In the optical laminate (second embodiment) of FIG. 2, a circular polarizing plate 30 has a λ/4 retardation plate 10a, a λ/2 retardation plate 10b, and a polarizing plate 20 in this order, and furthermore, an antireflection layer 40 is laminated on the circular polarizing plate.

In the present invention, in the case where the circular polarizing plate has only a λ/4 retardation plate as the retardation plate as in the case of the first embodiment, from the viewpoint of obtaining the desired L* and saturation, the λ/4 retardation plate is preferably a λ/4 retardation plate with reverse dispersion properties. In the case where the λ/4 retardation plate has positive dispersion properties (positive wavelength dispersion characteristics) or flat dispersion properties (flat wavelength dispersion characteristics), the transmitted light of the λ/4 retardation plate incident from the antireflection layer is transmitted into the display element side with circular polarized light, an ellipticity of which varies with the wavelength. In addition, with respect to the light returned from the display element side, when it transmits through the λ/4 retardation plate and goes to the viewer side, a retardation in which a wavelength conversion amount varies with the wavelength is given, and the light is emitted from the λ/4 retardation plate due to circular polarized light, an ellipticity of which varies with the wavelength, or linear polarized light. According to this, the returned light is color-shifted, so that it occasionally becomes difficult to obtain the desired L* and saturation. On the other hand, in comparison with the case of using the λ/4 retardation plate with positive dispersion properties and the λ/4 retardation plate with flat dispersion properties, in the case of using the λ/4 retardation plate with reverse dispersion properties, the change owing to the wavelength is suppressed, and even in the case where the aforementioned color shift is suppressed, and the wavelength is different, the color shift is reduced, and the hue of the viewed display image is improved, so that the desired L* and saturation can be obtained.

Here, α of the λ/4 retardation plate (a ratio (Re450)/(Re550) of an in-plane retardation (Re450) at a wavelength of 450 nm to an in-plane retardation (Re550) at a wavelength of 550 nm) is preferably 0.95 or less, more preferably 0.91 or less, still more preferably 0.88 or less, and yet still more preferably 0.85 or less. What the α falls within the aforementioned range is preferred because the state close to λ/4 is maintained over a wide range in the visible region. The α is obtained by measuring the in-plane retardation at a wavelength of 450 nm and the in-plane retardation at a wavelength of 550 nm by using a retardation measuring device and serves as an index of the wavelength dispersion properties.

In the present invention, according to a second embodiment, the circular polarizing plate has a λ/4 retardation plate and a λ/2 retardation plate. In the second embodiment, the retardation layer may be fabricated in such a manner that it is successively laminated together with a corresponding alignment film on a transparent substrate. Alternatively, after being separately fabricated, the retardation layer may be laminated integrally with the alignment film by the transfer method, or only the retardation layer may be laminated by the transfer method. Thus, there is no particular limitation.

In the second embodiment, by laminating the λ/4 retardation plate and the λ/2 retardation plate, the same effects as those in the first embodiment are obtained.

In the second embodiment, the λ/4 retardation plate may have positive dispersion properties, may have flat dispersion properties, or may have reverse dispersion properties, and is not particularly limited. However, from the viewpoint of economy, it is preferred that the λ/4 retardation plate has positive dispersion properties or flat dispersion properties.

In the second embodiment, it is preferred that the absorption axis of the polarizer, the alignment axis (slow axis) of the λ/2 retardation plate, and the alignment axis (slow axis) of the λ/4 retardation plate are each disposed clockwise or counterclockwise, to form angles of 15° and 75° in the same rotation direction.

[Display Panel and Display Device]

Although the display panel of the present invention is not particularly limited so long as it is one including the aforementioned optical laminate of the present invention having a display element provided therewith, it is preferred one including an organic electro luminescence display element (hereinafter also referred to as "organic EL display element") or micro light-emitting diode display element (hereinafter also referred to as "micro LED display element"), and more preferably one including an organic electro luminescence display element.

Although the display device of the present invention is not particularly limited so long as it is one including the display panel of the present invention provided therewith, it is preferably one including the display panel of the present invention, a drive controller electrically connected with the display panel, and a casing housing them therein.

In the present invention, the display device is preferably an organic electro luminescence display device (hereinafter also referred to as "organic EL display device"). The display device of the present invention is not limited thereto, and it may also be a micro LED display device. The organic EL display device and the micro LED display device are liable to especially cause the problem of the present invention because of a high reflectance, and these display devices are especially suitable for the present invention. Of these, the display device is preferably an organic electro luminescence display device.

The organic EL display device is a display device in which a light-emitting layer or plural light-emitting layer-containing organic compound thin films are formed between a pair of electrodes including a positive electrode and a negative electrode and has the display panel of the present invention on the viewing side of the organic EL display device. In addition, the organic compound thin film may have, in addition to the light-emitting layer, a hole injection layer, a hole transport layer, an electron injection layer, an electron transport layer, a protective layer, and so on, and these respective layers may be each one provided with other function. Each of the layers, such as the electrodes and the organic compound thin film of the organic EL display device, can be formed using known materials and methods.

The size of each of the display panel and the display device of the present invention is not particularly limited. However, since a visual recognition angle is liable to become large, and the change in hue due to the reflected light becomes more problematic, a display device of 55 inches or more, or a display panel using a display device of 55 inches or more is preferred.

The size of the display device is more preferably 65 inches or more, and still more preferably 70 inches or more. The display panel is more preferably a display panel for a display device of 65 inches or more, and still more preferably a display panel for a display device of 70 inches or more.

[Antireflection Layer, Circular Polarizing Plate, Retardation Plate, and Polarizing Plate]

The antireflection layer of the present invention is an antireflection layer to be used for the aforementioned display panel of the present invention, and its surface reflectance is 2% or less.

In addition, the circular polarizing plate, the retardation plate, and the polarizing plate of the present invention are a circular polarizing plate, a retardation plate, and a polarizing plate, respectively, each of which is used for the aforementioned display panel of the present invention.

EXAMPLES

The present invention is hereunder described in more detail by reference to Examples and Comparative Examples, but it should be construed that the present invention is by no means limited to these Examples.

Figure 3:
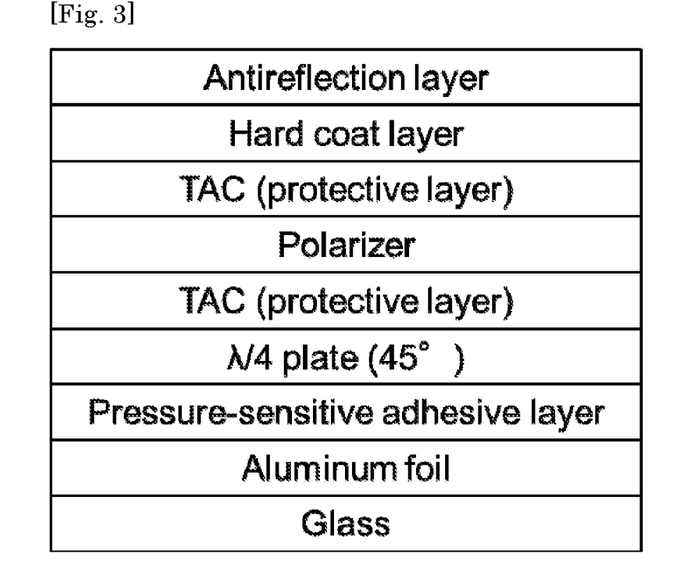
FIG. 3 is a cross-sectional view schematically showing an example of a layer configuration of the optical laminate fabricated in the section of Examples.
Figure 4:
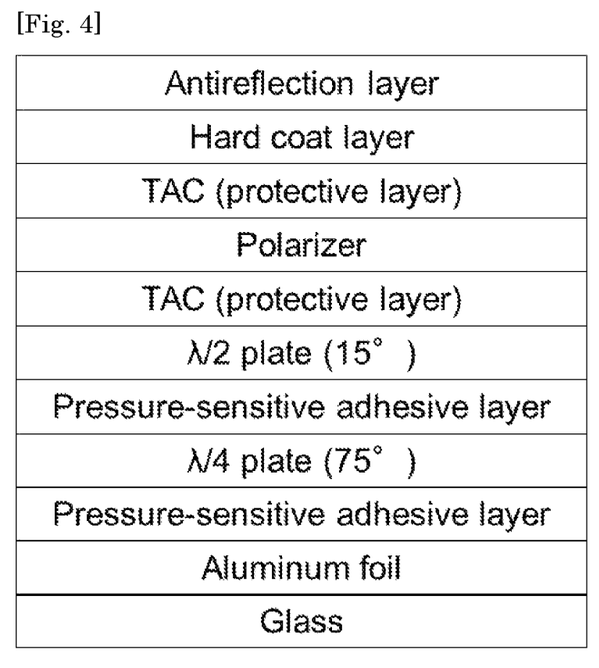
FIG. 4 is a cross-sectional view schematically showing another example of a layer configuration of the optical laminate fabricated in the section of Examples.

A sample having a layer configuration shown in the following FIG. 3 or FIG. 4 was fabricated, and by changing the kind of the retardation layer and the surface reflectance of the antireflection layer, values of L*, a*, and b* were measured, respectively in the SCI mode by using a spectrophotometer, CM-2600d (manufactured by Konica Minolta, Inc.). The values of L* and saturation are shown in Table below.

Each of layers used is as follows.
Each of layers used in the Examples is as follows.
Aluminum foil: Of a glossy surface and a matte surface, the glossy surface was disposed on the optical laminate side.
Pressure-sensitive adhesive layer: 10 μm-thick optical pressure-sensitive adhesive product, manufactured Lintec Corporation
$\lambda/4$ retardation plate (positive dispersion ($\alpha$=1.11), Re550=140 nm)
$\lambda/2$ retardation plate (positive dispersion ($\alpha$=1.11), Re550=240 nm)
$\lambda/4$ retardation plate (positive dispersion ($\alpha$=1.11), Re550=120 nm)
A material prepared by diluting a liquid crystal material of $\alpha$=1.11 with methyl ethyl ketone to a solid content of 20% was coated on a PET substrate, to fabricate a retardation plate. A coating thickness was regulated so as to have the aforementioned retardation value. The retardation plate was transferred from the PET substrate and used.
$\lambda/4$ retardation plate (flat dispersion ($\alpha$=1.01), Re550=140 nm)
$\lambda/2$ retardation plate (flat dispersion ($\alpha$=1.01), Re550=270 nm)
$\lambda/4$ retardation plate (flat dispersion ($\alpha$=1.01), Re550=140 nm)
A material prepared by mixing a liquid crystal material of $\alpha$=1.11 and a liquid crystal material of $\alpha$=0.91 in a ratio of 1/1 and diluting the mixture with N-methyl-2-pyrrolidone to a solid content of 20% was coated on a PET substrate, to fabricate a retardation plate. A coating thickness was regulated so as to have the aforementioned retardation value. The retardation plate was transferred from the PET substrate and used.
$\lambda/4$ retardation plate (reverse dispersion ($\alpha$=0.85), Re550=142 nm)
A material prepared by diluting a liquid crystal material of $\alpha$=0.85 with N-methyl-2-pyrrolidone to a solid content of 20% was coated on a PET substrate, to fabricate a retardation plate. A coating thickness was regulated so as to have the aforementioned retardation value. The retardation plate was transferred from the PET substrate and used.
$\lambda/4$ retardation plate (reverse dispersion ($\alpha$=0.91), Re550=142 nm)
A material prepared by diluting a liquid crystal material of $\alpha$=0.91 with N-methyl-2-pyrrolidone to a solid content of 20% was coated on a PET substrate, to fabricate a retardation plate. A coating thickness was regulated so as to have the aforementioned retardation value. The retardation plate was transferred from the PET substrate and used.
TAC: TD60UL, manufactured by FUJIFILM Corporation, refractive index=1.48
Polarizer: Iodine-doped stretched PVA
Hard coat layer: A material prepared by adding 3% of IRGACURE 907 to PET-30, manufactured by Nippon Kayaku Co., Ltd. was cured with ultraviolet rays, to fabricate a hard coat layer (refractive index=1.53). Thickness=5 μm
Antireflection layer:
(One having a surface reflectance Y of 1.52%): Low refractive index layer (refractive index=1.40, layer thickness=100 nm, Ra value=2 nm)
(One having a surface reflectance Y of 0.59%): Low refractive index layer (refractive index=1.32, layer thickness=100 nm, Ra value=3 nm)
(One having a surface reflectance Y of 0.12%): Low refractive index layer (refractive index=1.32, layer thickness=100 nm, Ra value=6 nm) and high refractive index layer (refractive index=1.63, layer thickness=160 nm)
The refractive indices of the substrate (TAC), the hard coat layer, the low refractive index layer, and the high refractive index layer are each a refractive index at a wavelength of 589 nm.

In addition, a reflection bottom wavelength of the laminate composed of the TAC, the hard coat layer, and the antireflection layer was 557 nm for one having the surface reflection Y of 1.52% (the antireflection layer is a single layer of the low refractive index layer having a refractive index of 1.40); 537 nm for one having the surface reflection Y of 0.59% (the antireflection layer is a single layer of the low refractive index layer having a refractive index of 1.32); and 550 nm for one having the surface reflection Y of 0.12% (the antireflection layer is of a laminate configuration of the high refractive index layer having a refractive index of 1.63 and the low refractive index layer having a refractive index of 1.32).

In Experimental Example 1, an angle formed between the absorption axis of the polarizer and the alignment axis of the $\lambda/4$ retardation plate with positive dispersion properties was set to 45°.

In Experimental Example 2, an angle formed between the absorption axis of the polarizer and the alignment axis of the $\lambda/4$ retardation plate with flat dispersion properties was set to 45°.

In Experimental Example 3, an angle formed between the absorption axis of the polarizer and the alignment axis of the $\lambda/4$ retardation plate with positive dispersion properties was set to 75°, and an angle formed between the absorption axis of the polarizer and the alignment axis of the $\lambda/2$ retardation plate with positive dispersion properties was set to 15°.

In Experimental Example 4, an angle formed between the absorption axis of the polarizer and the alignment axis of the $\lambda/4$ retardation plate with flat dispersion properties was set to 75°, and an angle formed between the absorption axis of the polarizer and the alignment axis of the $\lambda/2$ retardation plate with flat dispersion properties was set to 15°.

In Experimental Examples 5 and 6, an angle formed between the absorption axis of the polarizer and the alignment axis of the $\lambda/4$ retardation plate with reverse dispersion properties was set to 45°.

[Surface Reflection]
The evaluation criteria are as follows.
The appearance was judged by 30 people. As a result, the case where the surface reflection became strongly conspicuous, so that the appearance was hardly seen was scored as 0 point, whereas the case where the surface reflection was not particularly conspicuous was scored as 1 point, and a total point was scored as follows.

A: 20 points or more
C: 19 points or less

[Hue]

The evaluation criteria are as follows.

The appearance was judged by 30 people. As a result, the case where the color tint of reflection became strongly conspicuous, so that the appearance was hardly seen was scored as 0 point, whereas the case where the color tint of reflection was not particularly conspicuous was scored as 1 point, and a total point was scored as follows.

A: 20 points or more
C: 19 points or less with JIS Z8722:1982. The viewing angle was 2°, the light source was D65, and the measured wavelength was from 380 nm to 780 nm with an interval of 0.5 nm. In addition, the reflectance Y value was a value that was obtained with the specularly reflected light of the incident light that was incident on the surface of the sample on the side of the low refractive index layer at an incident angle of 5° with respect to the incident angle of light incident perpendicularly on the surface of the specimen being 0°. The Y value, L*, a*, and b* of the sample were measured, respectively by using an ultraviolet and visible spectrophotometer, V7100 (manufactured by JASCO Corporation).

The results are shown in the following Table 2.

TABLE 1

| Experimental Example | Wavelength dispersion properties | Retardation plate | Surface reflectance of antireflection layer | Hue evaluation | | | | Evaluation results | | |
|---|---|---|---|---|---|---|---|---|---|---|
| | | | | L* | a* | b* | Saturation | Surface reflection | Hue | Comprehensive evaluation |
| 1 | Positive dispersion (Comparative Example) | λ/4 140 nm 45° | Nil | 27.64 | 11.63 | −23.81 | 26.50 | C | C | C |
| | | | Y = 1.52% | 19.54 | 19.27 | −32.96 | 38.18 | A | C | C |
| | | | Y = 0.59% | 16.67 | 21.98 | −34.30 | 40.74 | A | C | C |
| | | | Y = 0.12% | 13.97 | 23.75 | −37.94 | 44.76 | A | C | C |
| 2 | Flat dispersion (Comparative Example) | λ/4 140 nm 45° | Nil | 25.55 | 6.79 | −13.62 | 15.22 | C | C | C |
| | | | Y = 1.52% | 16.65 | 14.35 | −20.35 | 24.90 | A | C | C |
| | | | Y = 0.59% | 12.26 | 16.39 | −25.19 | 30.05 | A | C | C |
| | | | Y = 0.12% | 8.67 | 19.02 | −27.52 | 33.45 | A | C | C |
| 3 | Positive dispersion (Example) | Wide-band 240 nm 15° 120 nm 75° | Nil | 27.61 | 2.80 | −2.99 | 4.10 | C | A | C |
| | | | Y = 1.52% | 18.12 | 6.47 | −4.36 | 7.80 | A | A | A |
| | | | Y = 0.59% | 15.15 | 7.39 | −7.99 | 10.88 | A | A | A |
| | | | Y = 0.12% | 12.41 | 6.91 | −6.60 | 9.56 | A | A | A |
| 4 | Flat dispersion (Example) | Wide-band 270 nm 15° 140 nm 75° | Nil | 24.74 | −0.09 | −0.92 | 0.92 | C | A | C |
| | | | Y = 1.52% | 15.17 | 1.90 | −0.62 | 2.00 | A | A | A |
| | | | Y = 0.59% | 10.49 | 2.28 | −5.37 | 5.83 | A | A | A |
| | | | Y = 0.12% | 6.45 | −0.24 | −3.41 | 3.42 | A | A | A |
| 5 | Reverse dispersion α = 0.85 (Example) | λ/4 142 nm 45° | Nil | 25.11 | −0.30 | −2.27 | 2.29 | C | A | C |
| | | | Y = 1.52% | 15.59 | 1.87 | −3.39 | 3.87 | A | A | A |
| | | | Y = 0.59% | 10.99 | 2.34 | −8.09 | 8.42 | A | A | A |
| | | | Y = 0.12% | 6.91 | 0.01 | −6.48 | 6.48 | A | A | A |
| 6 | Reverse dispersion α = 0.91 (Example) | λ/4 142 nm 45° | Nil | 25.25 | 2.58 | −2.90 | 3.88 | C | A | C |
| | | | Y = 1.52% | 15.93 | 6.73 | −4.67 | 8.19 | A | A | A |
| | | | Y = 0.59% | 11.59 | 8.22 | −8.51 | 11.83 | A | A | A |
| | | | Y = 0.12% | 8.30 | 8.09 | −7.24 | 10.86 | A | A | A |

[Comprehensive Evaluation]

The evaluation criteria are as follows.

A: The evaluation of the surface reflection is ranked as "A", and the evaluation of the hue is ranked as "A".

C: At least one of the evaluation of the surface reflection and the evaluation of the hue is ranked as "C".

[Measurement of Surface Reflectance of Antireflection Layer, L*, a*, and b*]

A sample in which a black plate (manufactured by Kuraray Co., Ltd., a trade name: COMOGLAS DFA2CG 502K (black) Series, total light transmittance=0%, thickness=2 mm, refractive index=1.49) was stuck on the surface of the transparent substrate of the antireflective layer on the opposite side to the low refractive index layer via a transparent pressure-sensitive adhesive layer (manufactured by Panac Co., Ltd., a trade name: PANACLEAN PD-S1, refractive index=1.49) was fabricated.

A reflection Y value of the surface of the sample on the low refractive index layer side was measured in conformity

TABLE 2

| Surface reflectance of antireflection layer | Hue evaluation | | | | |
|---|---|---|---|---|---|
| | L* | Y | a* | b* | Saturation |
| Y = 1.52% | 9.33 | 1.52 | 2.70 | 0.97 | 2.87 |
| Y = 0.59% | 5.35 | 0.59 | 4.22 | −6.49 | 7.74 |
| Y = 0.12% | 1.08 | 0.12 | 1.36 | −1.93 | 2.36 |

As shown in Table 1, in the optical laminate including a circular polarizing plate having a retardation plate and a polarizer, and an antireflection layer having a surface reflectance of 2% or less, wherein L* of light incident from the antireflection layer side in the SCI mode is 20 or less, and a saturation is 20 or less, the comprehensive evaluation was A. Here, the aforementioned optical laminate was obtained in the case of using, as the retardation plate, a wide-band retardation plate (λ/2 retardation plate and λ/4 retardation plate), or a λ/4 retardation plate with reverse dispersion properties.

On the other hand, in the case of not providing an antireflection layer having a surface reflectance of 2% or less, the evaluation of the surface reflection was ranked as "C", and even in the case of using any retardation plate, the results revealed the rank "C" in the comprehensive evaluation.

In addition, in the case of using, as the retardation plate, the λ/4 retardation plate with positive dispersion properties or the λ/4 retardation plate with flat dispersion properties, the desired L* and saturation could not be obtained.

In the case of allowing the reflection bottom wavelength of the laminate composed of TAC, the hard coat layer, and the antireflection layer in Experimental Examples 5 and 6 to fall within the suitable range in this specification (preferably 500 to 545 nm, more preferably 510 to 540 nm, and still more preferably 515 to 535 nm), the more suitable the range, the lower the color tint and the more favorable the visibility.

REFERENCE SIGNS LIST

10a: λ/4 retardation plate
10b: λ/2 retardation plate
20: Polarizing plate
30: Circular polarizing plate
40: Antireflection layer

The invention claimed is:

1. An optical laminate comprising
a circular polarizing plate having a retardation plate and a polarizer, and an antireflection layer having a surface reflectance of 2% or less, wherein the retardation plate has reverse dispersion characteristics,
a wavelength at which a spectral reflectance of the antireflection layer at an incidence angle of 5° exhibits a minimum value is 500 to 545 nm, such that a reflection light of the antireflection layer has a reddish tint, wherein the reddish tint of the reflection light of the antireflection layer at least partially offsets a bluish tint of a reflection light of the retardation plate,
the antireflection layer is provided on the polarizer side of the circular polarizing plate; and
L* of light incident from the antireflection layer side in a specular component included
(SCI) mode is 20 or less, and a saturation is 20 or less.

2. The optical laminate according to claim 1, wherein an arithmetic average roughness Ra of the antireflection layer in a cutoff value of 0.08 mm according to JIS B0601: 1994 is 50 nm or less.

3. The optical laminate according to claim 1, wherein the circular polarizing plate has a ¼ wavelength retardation plate having reverse dispersion wavelength characteristics.

4. The optical laminate according to claim 1, wherein the circular polarizing plate has a ¼ wavelength retardation plate and a ½ wavelength retardation plate.

5. A display panel comprising the optical laminate according to claim 1.

6. A display device comprising the display panel according to claim 5.

7. The display device according to claim 6, wherein the display device is an organic electro luminescence display device.

8. The optical laminate according to claim 1, wherein the wavelength at which the spectral reflectance of the antireflection layer at an incidence angle of 5° exhibits a minimum value is 510 to 540 nm.

9. The optical laminate according to claim 1, wherein the wavelength at which the spectral reflectance of the antireflection layer at an incidence angle of 5° exhibits a minimum value is 515 to 535 nm.

* * * * *